(12) United States Patent
Kubota et al.

(10) Patent No.: US 10,886,135 B2
(45) Date of Patent: Jan. 5, 2021

(54) SUBSTRATE PROCESSING METHOD AND SUBSTRATE PROCESSING APPARATUS

(71) Applicant: TOKYO ELECTRON LIMITED, Tokyo (JP)

(72) Inventors: Shinji Kubota, Miyagi (JP); Kazuya Nagaseki, Miyagi (JP); Akihiro Yokota, Miyagi (JP); Gen Tamamushi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/183,945

(22) Filed: Nov. 8, 2018

(65) Prior Publication Data

US 2019/0148155 A1 May 16, 2019

(30) Foreign Application Priority Data

Nov. 10, 2017 (JP) ................................. 2017-217120

(51) Int. Cl.
*H01L 21/3065* (2006.01)
*H01L 21/67* (2006.01)
*H01J 37/32* (2006.01)
*H01L 21/311* (2006.01)

(52) U.S. Cl.
CPC ...... *H01L 21/3065* (2013.01); *H01J 37/3233* (2013.01); *H01J 37/3244* (2013.01); *H01J 37/32715* (2013.01); *H01L 21/31116* (2013.01); *H01L 21/67069* (2013.01)

(58) Field of Classification Search
None
See application file for complete search history.

(56) References Cited

U.S. PATENT DOCUMENTS

| | | | | |
|---|---|---|---|---|
| 6,335,535 | B1 * | 1/2002 | Miyake | H01J 37/32412 250/492.21 |
| 6,511,575 | B1 * | 1/2003 | Shindo | B08B 7/0035 204/298.34 |
| 2012/0258601 | A1 * | 10/2012 | Holland | H01J 37/32357 438/729 |
| 2016/0276134 | A1 * | 9/2016 | Collins | H01J 37/3233 |
| 2016/0293386 | A1 * | 10/2016 | Chen | H01J 37/32596 |
| 2017/0372899 | A1 * | 12/2017 | Yang | C01B 32/25 |

FOREIGN PATENT DOCUMENTS

JP          7-272659 A         10/1995

* cited by examiner

*Primary Examiner* — Allan W. Olsen
(74) *Attorney, Agent, or Firm* — Rothwell, Figg, Ernst & Manbeck, P.C.

(57) ABSTRACT

In a substrate processing method, electrons having a first energy are supplied from an electron beam generator into an inner space of a chamber body of a substrate processing apparatus to generate negative ions by attaching the electrons to molecules in a processing gas supplied to the inner space. Then a positive bias voltage is applied to an electrode of a supporting table that supports a substrate mounted on thereon in the inner space to attract the negative ions to the substrate.

12 Claims, 10 Drawing Sheets

SUBSTRATE PROCESSING METHOD AND SUBSTRATE PROCESSING APPARATUS

CROSS-REFERENCE TO RELATED APPLICATIONS

This application claims priority to Japanese Patent Application No. 2017-217120 filed on Nov. 10, 2017, the entire contents of which are incorporated herein by reference.

FIELD OF THE INVENTION

The present disclosure relates to a substrate processing method and a substrate processing apparatus.

BACKGROUND OF THE INVENTION

When electronic devices are manufactured, substrate processing is performed. In one of the substrate processing, a substrate is processed by ions obtained by dissociating molecules in a processing gas. Plasma processing is known as such substrate processing. In the plasma processing, plasma is generated by exciting a processing gas. The substrate is processed by ions from the generated plasma. For example, the substrate is etched by ions.

Japanese Patent Application Publication No. H7-272659 discloses an electron beam excited ion plasma generator. The apparatus disclosed therein is configured to generate plasma by using an electron beam and perform dry etching of the substrate with ions from the plasma.

Along with the demand for higher integration of elements in an electronic device, substrate processing for a deep portion of an opening is required. For example, the substrate processing for a deep portion of an opening having a high aspect ratio or the substrate processing for forming an opening having a high aspect ratio on a substrate is required. In order to perform the substrate processing for the deep portion of the opening, it is required to supply ions to the deep portion of the opening.

SUMMARY OF THE INVENTION

In accordance with an aspect, there is provided a substrate processing method including: (i) a step of supplying electrons having a first energy from an electron beam generator into an inner space of a chamber body of a substrate processing apparatus to generate negative ions by attaching the electrons to molecules in a processing gas supplied to the inner space; and (ii) a step of applying a positive bias voltage to an electrode of a supporting table that supports a substrate mounted on thereon in the inner space to attract the negative ions to the substrate.

In accordance with another aspect, there is provided a substrate processing apparatus including: a chamber body having an inner space; a supporting table configured to support a substrate mounted thereon in the inner space, the supporting table including an electrode; a gas supply unit configured to supply a processing gas to the inner space; an electron beam generator configured to supply electrons to the inner space; a bias power supply configured to generate a bias voltage and electrically connected to the electrode of the supporting table; and a control unit configured to control the electron beam generator and the bias power supply. The control unit controls the electron beam generator to supply electrons having a first energy to the inner space in order to generate negative ions by attaching electrons to molecules in the processing gas supplied to the inner space; and controls the bias power supply to apply a positive bias voltage to the electrode of the supporting table in order to attract the negative ions to the substrate mounted on the supporting table.

BRIEF DESCRIPTION OF THE DRAWINGS

The objects and features of the present disclosure will become apparent from the following description of embodiments, given in conjunction with the accompanying drawings, in which.

DETAILED DESCRIPTION OF THE EMBODIMENTS

Figure 1:
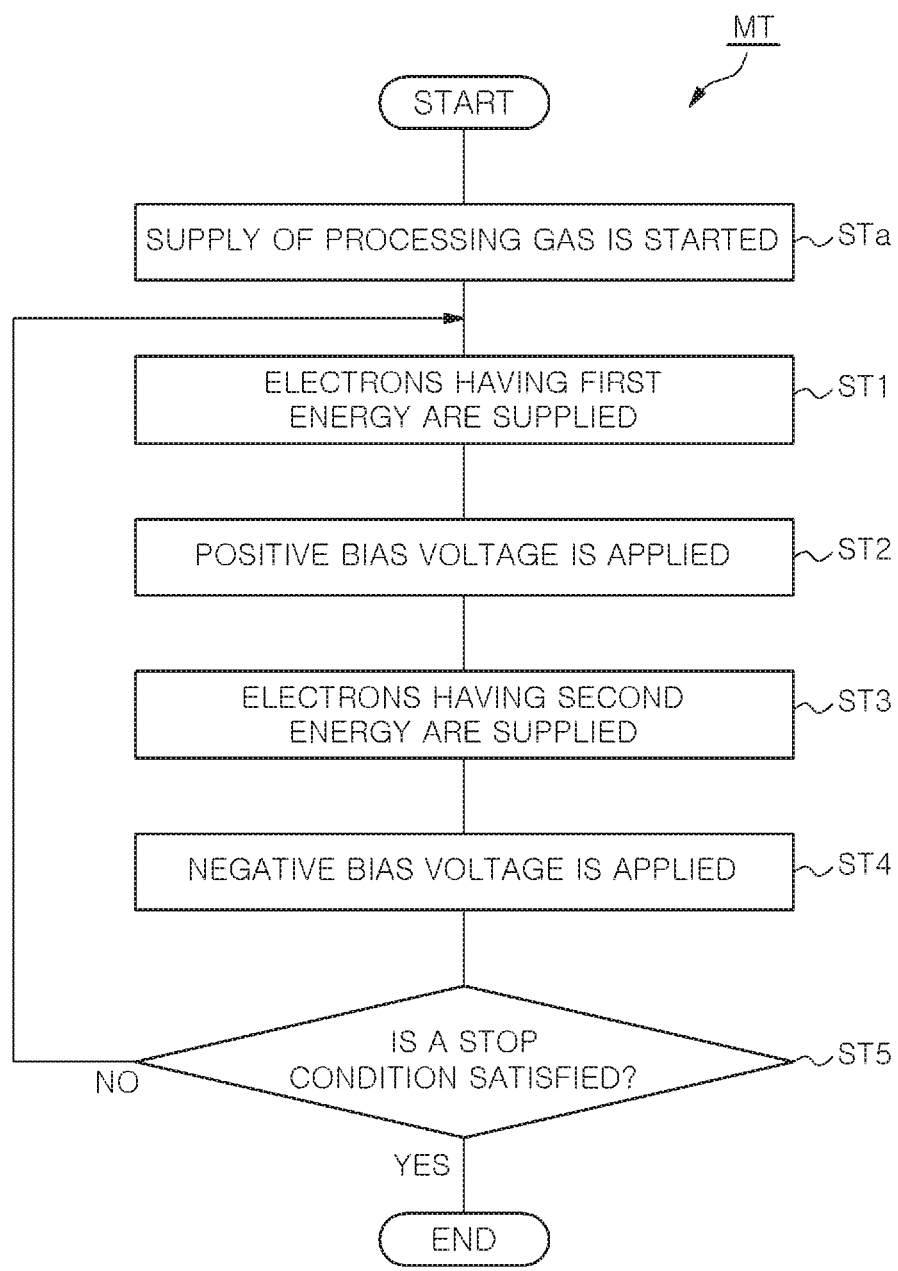
FIG. 1 is a flowchart showing a substrate processing method according to an embodiment.

Hereinafter, embodiments will be described in detail with reference to the accompanying drawings. Like reference numerals will be given to like or corresponding parts throughout the drawings, and redundant description thereof will be omitted.

FIG. 1 is a flowchart showing a substrate processing method according to an embodiment. The substrate processing method (hereinafter, referred to as "method MT") shown in FIG. 1 is performed to process a substrate by negative ions. The method MT is performed by using a substrate processing apparatus.

Figure 2:
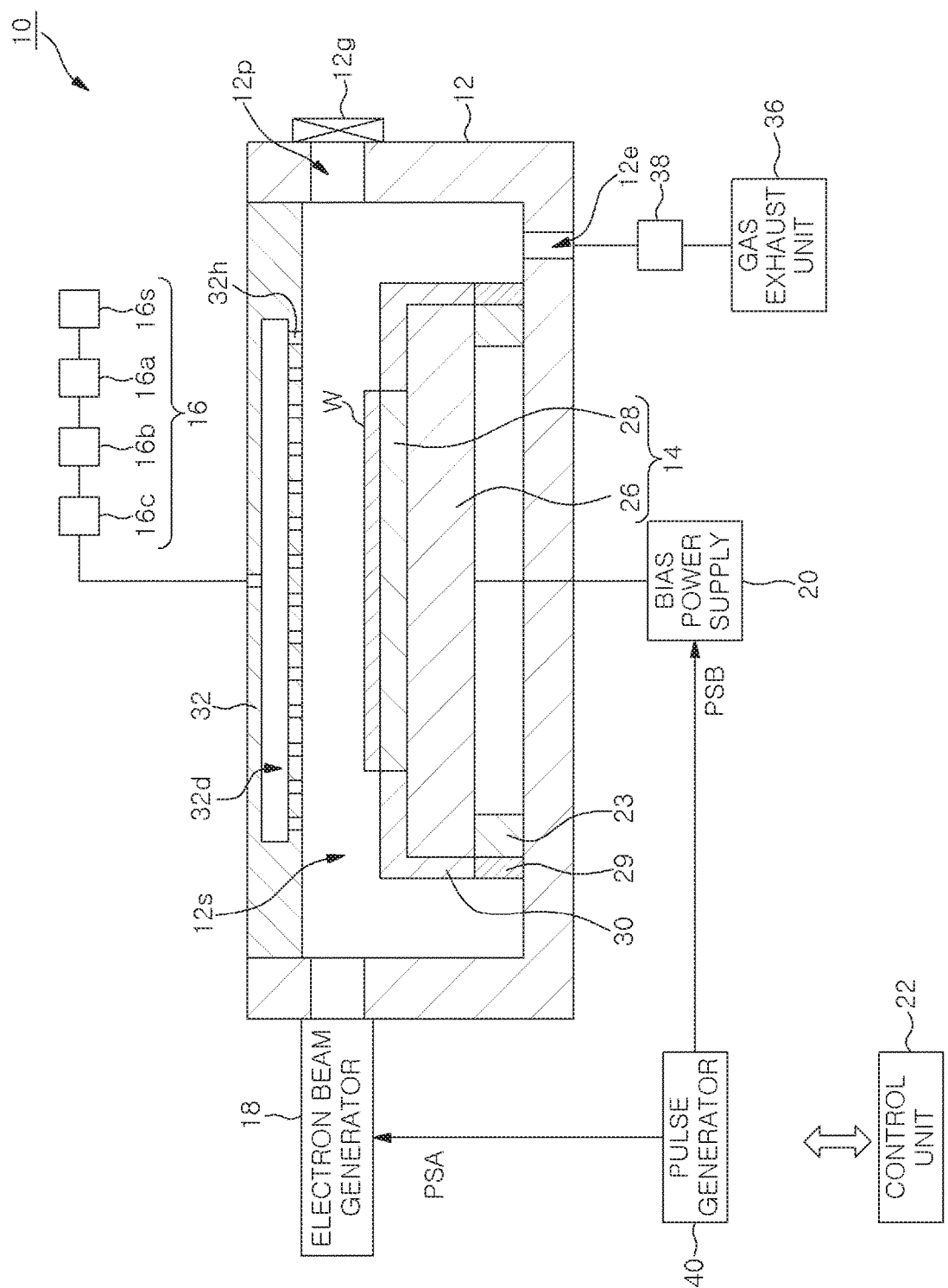
FIG. 2 shows a substrate processing apparatus according to an embodiment.

FIG. 2 shows a substrate processing apparatus according to an embodiment. FIG. 2 shows the substrate processing apparatus 10 with a part thereof cutout. The substrate processing apparatus 10 can be used for performing the method MT. The substrate processing apparatus 10 includes a chamber body 12, a supporting table 14, a gas supply unit 16, an electron beam generator 18, a bias power supply 20, and a control unit 22.

The chamber body 12 has an inner space 12s therein. The chamber body 12 has a substantially cylindrical shape. The chamber body 12 is made of, e.g., aluminum or the like. A corrosion resistant film is formed on a surface of the inner space 12s of the chamber body 12. This film may be, e.g., an alumite film formed by anodic oxidation treatment, or a ceramic film made of yttrium oxide. The chamber body 12 is grounded.

A passage 12p is formed in a sidewall of the chamber body 12. The substrate W is transferred between the inner space 12s and the outside of the chamber body 12 through the passage 12p. The passage 12p can be opened and closed by a gate valve 12g. The gate valve 12g is provided along the sidewall of the chamber body 12.

A support 23 extends upward from a bottom portion of the chamber body 12. The support 23 is made of an insulating material. The support 23 may be made of aluminum oxide or ceramic such as quartz or the like. The support 23 supports the supporting table 14. The supporting table 14 is provided in the inner space 12s. The supporting table 14 is configured to support the substrate W mounted thereon in the inner space 12s.

The supporting table 14 has an electrode 26. In one embodiment, the supporting table 14 further includes an electrostatic chuck 28. The electrode 26 has a substantially disk shape. The electrode 26 is made of a metal such as aluminum or the like. The electrostatic chuck is provided on the electrode 26. The substrate W is mounted on the electrostatic chuck 28. The electrostatic chuck 28 has a main body made of a dielectric material and a film-shaped electrode provided in the main body. A DC power supply is electrically connected to the electrode of the electrostatic chuck 28 via a switch. When a voltage from the DC power supply is applied to the electrode of the electrostatic chuck 28, an electrostatic attractive force is generated between the substrate W and the electrostatic chuck 28. Due to the generated electrostatic attractive force, the substrate W is attracted and held on the electrostatic chuck 28.

A bias power supply 20 is connected to the electrode 26. The bias power supply 20 is configured to generate a bias voltage for attracting ions generated in the inner space 12s to the substrate W. The bias power supply 20 is a DC power supply and is configured to apply a voltage having a specified polarity and a specified level to the electrode 26 within a specified period.

In one embodiment, a pulse generator 40 is connected to the bias power supply 20. The pulse generator 40 is configured to provide a pulse signal PSB to the bias power supply 20. The pulse generator 40 sets a signal level of the pulse signal PSB to have a first level in a period specified by the control unit 22 and have a second level in a period before and after the specified period. The first level is one of a high level and a low level, and the second level is the other one. The bias power supply 20 applies a bias voltage to the electrode 26 during the period in which the signal level of the pulse signal PSB is the first level. On the other hand, the bias power supply 20 does not apply a bias voltage to the electrode 26 during the period in which the signal level of the pulse signal PSB is the second level. The bias power supply 20 sets a level and a polarity (negative polarity or positive polarity) of the bias voltage in response to a control signal from the control unit 22.

In one embodiment, a member 29 is provided to surround the support 23. The member 29 has a substantially cylindrical shape and is made of a conductive material such as aluminum or the like. The member 29 is grounded. A corrosion resistant film is formed on a surface of the member 29. This film may be, e.g., an alumite film formed by anodic oxidation treatment or a ceramic film made of yttrium oxide.

In one embodiment, a member 30 is provided to surround the electrode 26 and the electrostatic chuck 28. The member extends on the member 29. The member 30 has a substantially cylindrical shape and may be made of aluminum oxide or ceramic such as quartz or the like.

An upper end of the chamber body 12 is opened. The opening at the upper end of the chamber body 12 is closed by a ceiling portion 32. The ceiling portion 32 constitutes a shower head in one embodiment. A gas diffusion space 32d is formed in the ceiling portion 32. A plurality of gas injection holes 32h is formed in the ceiling portion 32. The gas injection holes 32h extend in a vertical direction between the gas diffusion space 32d and the inner space 12s.

The gas supply unit 16 is connected to the gas diffusion space 32d. The gas supply unit 16 is configured to supply a gas to the inner space 12s. The gas supply unit 16 includes a gas source group 16s, a valve group 16a, a flow rate controller group 16b, and a valve group 16c. The gas source group 16s includes one or more gas sources. One or more gas sources are sources of one or more gases used in the method MT. Each of the valve group 16a and the valve group 16c includes one or more valves. The flow rate controller group 16b includes one or more flow rate controllers. Each of one or more flow rate controllers is a mass flow controller or a pressure control type flow rate controller. Each of one or more gas sources of the gas source group 16s is supplied to the gas diffusion space 32d via a corresponding valve of the valve group 16a, a corresponding flow controller of the flow rate controller group 16b, and a corresponding valve of the valve group 16c. The gas outputted from the gas supply unit 16 is supplied to the inner space 12s via the gas diffusion space 32d and the gas injection holes 32h. The gas supply unit 16 is controlled by the control unit 22 so that a flow rate of each of one or more gases to be outputted can be set to a specified level.

A gas exhaust port 12e is formed at the bottom portion of the chamber body 12. A gas exhaust unit 36 is connected to the gas exhaust port 12e via a pressure control valve 38. The gas exhaust unit 36 has one or more vacuum pumps such as a turbo molecular pump, a dry pump and the like. The gas exhaust unit 36 and the pressure control valve 38 are controlled by the control unit 22 so that a pressure in the inner space 12s can be set to a specified pressure.

The electron beam generator 18 is configured to supply electrons to the inner space 12s in order to generate ions of molecules in the processing gas supplied from the gas supply unit 16 to the inner space 12s. In one embodiment, the pulse generator 40 is connected to the electron beam generator 18. The pulse generator 40 is configured to provide a pulse signal PSA to the electron beam generator 18. The pulse generator 40 sets a signal level of the pulse signal PSA to a first level during a period specified by the control unit 22 and a second level during a period before and after the specified period. The first level is one of a high level and a low level, and the second level is the other one. The electron beam generator 18 supplies electrons to the inner space 12s during the period in which the signal level of the pulse signal PSA is the first level. On the other hand, the electron beam generator 18 does not generate electrons during the period in which the signal level of the pulse signal PSA is the second level. The electron beam generator 18 is configured to set an energy of electrons to be supplied to the inner space 12s in response to a control signal from the control unit 22.

The electron beam generator 18 is configured to supply electrons having distribution of energy having excellent monochromaticity to the inner space 12s. In one embodiment, the distribution of the energy of the electrons supplied by the electron beam generator 18 satisfies $\Delta Ei/Ei<0.4$. Here, Ei indicates a peak value in the distribution of the energy of the electrons supplied by the electron beam generator 18. ΔEi may be a full width at half maximum of energy of the electrons in the distribution of the energy of the electrons supplied by the electron beam generator 18. In the electron energy distribution, the horizontal axis represents the energy of electrons and the vertical axis represents the number of electrons.

Figure 3:
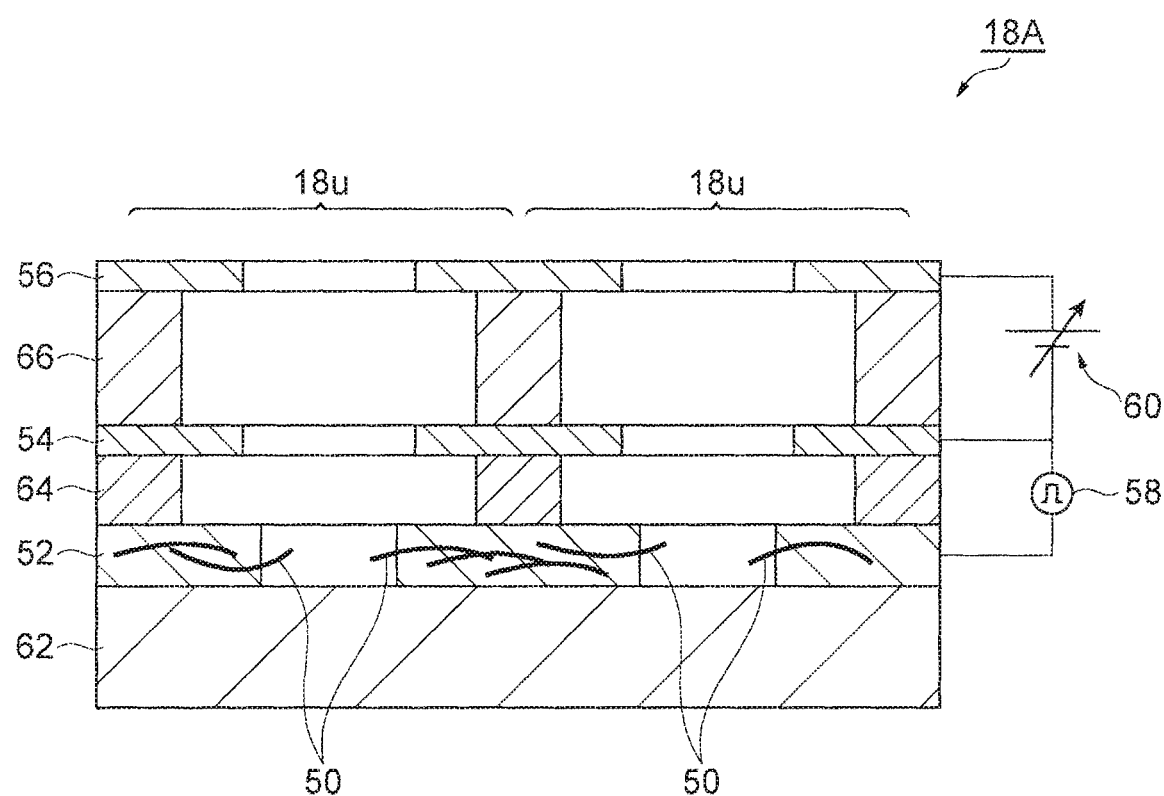
FIG. 3 is a partially enlarged cross sectional view of an electron beam generator according to an embodiment which can be used in the substrate processing apparatus shown in FIG. 2.

FIG. 3 is a partially enlarged cross sectional view of an electron beam generator according to an embodiment which can be used in the substrate processing apparatus shown in FIG. 2. The electron beam generator 18A shown in FIG. 3 can be used as the electron beam generator 18. The electron beam generator 18A includes solid state emitters 50, an electrode 52, an electrode 54, an electrode 56, a first power supply 58, and a second power supply 60. The solid state emitter 50 is a generation source of electrons. The solid state emitter 50 is, e.g., a carbon nanotube.

The electrode 52 is provided on one main surface of a base substrate 62. The electrode 52 is made of a conductive material. The electrode 52 is a film-shaped or layer-shaped electrode and provides one or more openings on the base substrate 62. The solid state emitter 50 protrudes from the inside of the electrode 52 to one or more openings of the electrode 52.

The electrode 52 and the electrode 54 constitute a pair of first electrodes. The electrode 54 is made of a conductive material. The electrode 54 is a film-shaped or layer-shaped electrode and extends substantially in parallel with the electrode 52. The electrode 54 provides one or more openings. One or more openings of the electrode 54 respectively face one or more openings of the electrode 52 along a direction perpendicular to the one main surface of the base substrate 62. An intermediate layer 64 is provided between the electrode 52 and the electrode 54. The intermediate layer 64 is made of an insulating material. The intermediate layer 64 provides one or more spaces. Each of the spaces of the intermediate layer 64 is provided between the corresponding openings of the electrode 52 and the electrode 54.

A first power supply 58 is connected between the electrode 52 and the electrode 54. The first power supply is a DC power supply (or a pulse power supply). The first power supply 58 is configured to apply a voltage between the electrode 52 and the electrode 54 (i.e., between the pair of first electrodes) during a period in which the signal level of the pulse signal PSA is the first level. When a voltage is applied between the electrode 52 and the electrode 54 by the first power supply 58, an electric field is generated between the electrode 52 and the electrode 54. Electrons are emitted from the solid state emitter 50 by the generated electric field.

The electrode 54 and the electrode 56 constitute a pair of second electrodes. The electrode 56 is made of a conductive material. The electrode 56 is a film-shaped or layer-shaped electrode and extends substantially in parallel with the electrode 54. The electrode 56 provides one or more openings. One or more openings of the electrode 56 respectively face one or more openings of the electrode 54 along a direction perpendicular to the one main surface of the base substrate 62. An intermediate layer 66 is provided between the electrode 54 and the electrode 56. The intermediate layer 66 is made of an insulating material. The intermediate layer 66 provides one or more spaces. Each of the spaces of the intermediate layer 66 is provided between the corresponding openings of the electrode 54 and the electrode 56.

A second power supply 60 is connected between the electrode 54 and the electrode 56. The second power supply 60 is a variable DC power supply. The second power supply 60 is configured to apply a voltage between the electrode 54 and the electrode 56 (i.e., between the pair of second electrodes) during a period in which the signal level of the pulse signal PSA is the first level. When a voltage is applied between the electrode 54 and the electrode 56 by the second power supply 60, an electric field is generated between the electrode 54 and the electrode 56. The electrons emitted from the solid state emitter 50 are released from the openings of the electrode 56 while being accelerated by the electric field between the electrode 54 and the electrode 56, and then are supplied to the inner space 12s. The level of the voltage applied between the electrode 54 and the electrode 56 by the second power supply 60 is controlled so that the energy of electrons supplied from the electron beam generator 18A to the inner space 12s can be set to the energy specified by the control unit 22. In the electron beam generator 18A, the electrons emitted from the solid state emitter 50 have an intrinsic energy determined by a material of the solid state emitter 50. The energy of electrons emitted from the electron beam generator 18A while being accelerated between the electrode 54 and the electrode 56 is controlled by the level of the voltage applied between the electrode 54 and the electrode 56 by the second power supply 60. Therefore, the electron beam generator 18A can supply the electrons having distribution of the energy having excellent monochromaticity and having a desired energy to the inner space 12s.

Figure 4:
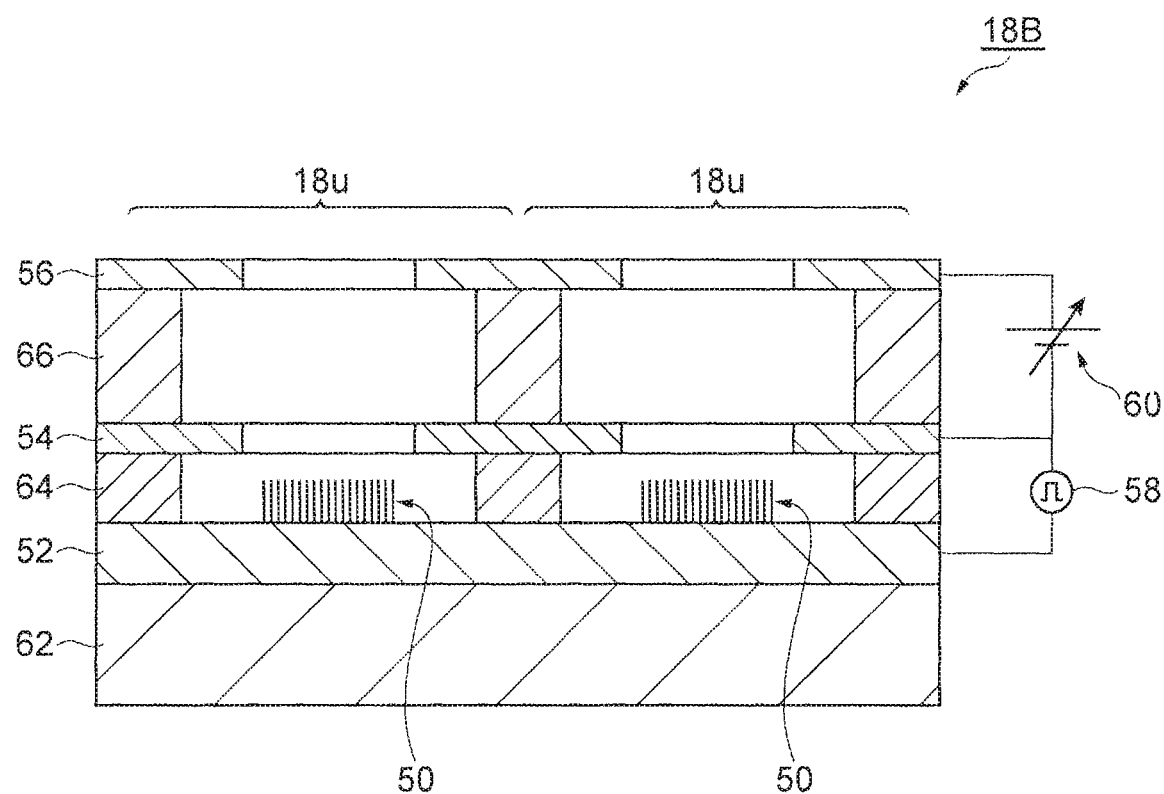
FIG. 4 is a partially enlarged cross sectional view of an electron beam generator according to another embodiment which can be used in the substrate processing apparatus shown in FIG. 2.

FIG. 4 is a partially enlarged cross sectional view of an electron beam generator according to another embodiment which can be used in the substrate processing apparatus shown in FIG. 2. The electron beam generator 18B shown in FIG. 4 can be used as the electron beam generator 18. The electrode 52 of the electron beam generator 18B provides no opening, unlike the electrode 52 of the electron beam generator 18A. In other words, the electrode 52 of the electron beam generator 18B uniformly extends on the base substrate 62. The solid state emitter 50 protrudes from the surface of the electrode 52 into one or more openings provided by the intermediate layer 64. The electron beam generator 18B can also supply electrons having distribution of the energy having excellent monochromaticity and having a desired energy to the inner space 12s.

Referring back to FIG. 2, the control unit 22 is configured to control the respective components of the substrate processing apparatus 10 as described above. The control unit 22 is, e.g., a computer device, and includes a processor such as a CPU or the like, a storage device such as a memory or the like, a display device, an input device such as a mouse, a keyboard or the like, and an input/output interface of a control signal. A control program and a recipe data are stored in a storage part of the control unit 22. The processor of the control unit 22 executes the control program and controls the respective components of the substrate processing apparatus 10 based on the recipe data. The control unit 22 controls the electron beam generator 18 and the bias power supply 20 to perform the method MT. The control unit 22 may further control the gas supply unit 16, the gas exhaust unit 36, the pressure control valve 38 and the pulse generator 40 to perform the method MT. The control executed by the control unit 22 at the time of performing the method MT, i.e., first to fourth control, will be described later.

Figure 5:
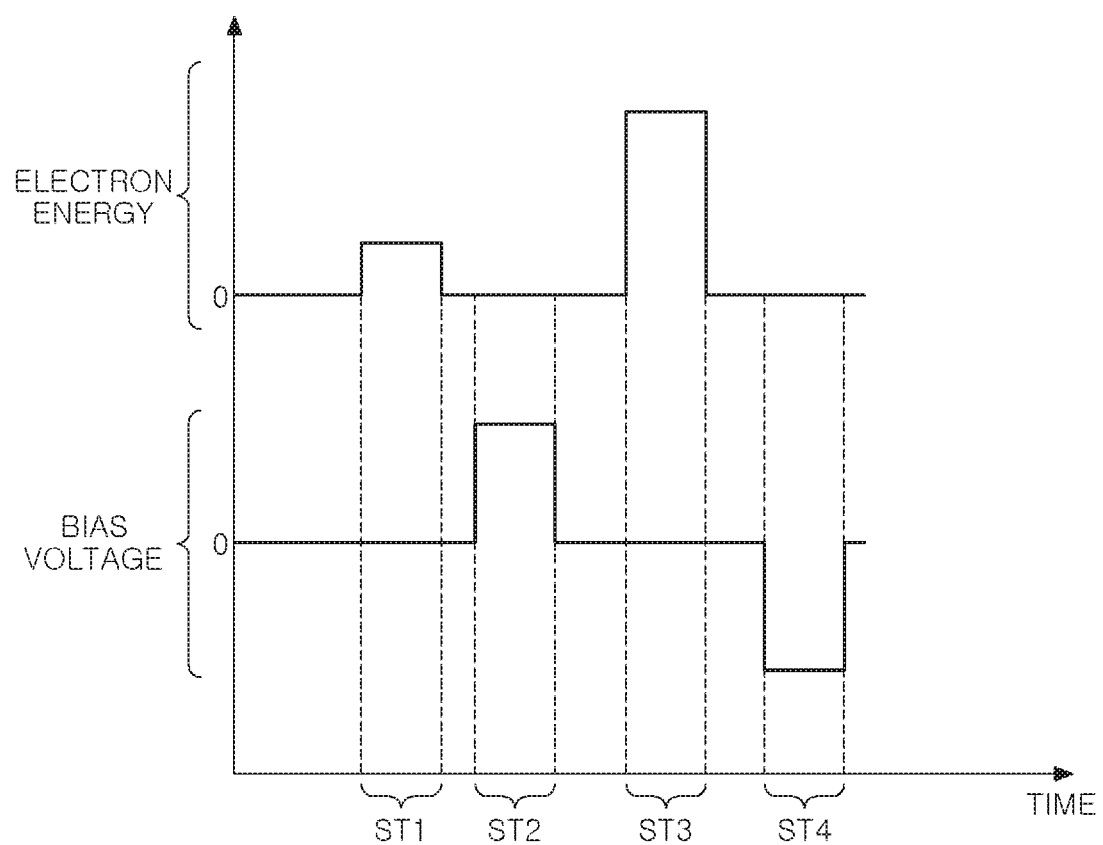
FIG. 5 is a timing chart related to the substrate processing method shown in FIG. 1.

Referring back to FIG. 1, the method MT performed by using the substrate processing apparatus 10 will be described as an example. However, the method MT may be performed by using an apparatus other than the substrate processing apparatus. In the following description, FIGS. 1 and 5 will be referred to. FIG. 5 is a timing chart related to the substrate processing method shown in FIG. 1. In FIG. 5, the horizontal axis represents time and the vertical axis represents an electron energy and a bias voltage. The energy of electrons shown in FIG. 5 indicates the energy of electrons supplied from the electron beam generator 18 to the inner space 12s. The bias voltage shown in FIG. 5 indicates a level of the bias voltage applied from the bias power supply 20 to the electrode 26 of the supporting table 14.

In the method MT, prior to a step STa, the substrate W is mounted on the supporting table 14, i.e., on the electrostatic chuck 28. The substrate W is held by the electrostatic chuck 28.

In the step STa, the supply of a processing gas from the gas supply unit 16 to the inner space 12s is started. In the step STa, the gas supply unit 16 is controlled by the control unit 22. In the case of etching a silicon film of a substrate W in the method MT, the processing gas contains one or more halogen-containing gases such as $Cl_2$ gas, HBr gas, $SF_6$ gas, and the like. In the case of etching a silicon oxide film of the substrate W in the method MT, the processing gas contains one or more fluorocarbon gases such as $CF_4$ gas, $C_4F_8$ gas, and the like. In the case of etching a silicon nitride film of the substrate W in the method MT, the processing gas contains one or more hydrofluorocarbon gases such as $CH_2F_2$ gas, $CHF_3$ gas, and the like. The processing gas may contain one or more other gases such as oxygen gas, a rare gas and the like.

The supply of the processing gas which is started in the step STa is continued until one or more executions of a sequence, including steps ST1 to ST4 to be described later, are completed. During a period from the start of the supply of the processing gas at least in the step STa to the completion of the one or more executions of the sequence including the steps ST1 to ST4, a pressure in the inner space 12s is set to a level specified by the control unit 22. Specifically, the control unit 22 controls the gas exhaust unit 36 and the pressure control valve 38 to adjust the pressure in the inner space 12s.

Next, the step ST1 of the method MT is executed. In the step ST1, electrons having a first energy are supplied from the electron beam generator 18 to the inner space 12s. In the step ST1, the control unit 22 performs first control to control the electron beam generator 18.

Specifically, the control unit 22 controls the electron beam generator 40 to transmit a pulse signal PSA having the first level during the execution period of the step ST1 and having the second level during a period before and after the execution period of the step ST1 to the electron beam generator 18. The first power supply 58 applies a voltage between the electrode 52 and the electrode 54 during the execution period of the step ST1 in response to the pulse signal PSA. In the step ST1, the control unit 22 supplies a voltage setting signal to the electron beam generator 18. The second power supply 60 applies a voltage having a level corresponding to the voltage setting signal between the electrode 54 and the electrode 56 during the execution period of the step ST1 which is specified by the pulse signal PSA. In the step ST1, the electrons having the first energy are generated by the electron beam generator 18 and supplied to the inner space 12s. As shown in FIG. 5, the first energy is lower than a second energy of electrons generated in the step ST3 to be described later. The first energy is used for attaching electrons to molecules contained in the processing gas and is uniquely determined by physical properties of the molecules contained in the processing gas. For example, the first energy is 0.5 eV or less. Even in the case of halogen-containing molecules such as $CF_4$, $C_4F_8$, c-$C_4F_8$, $Cl_2$, $SF_6$ and the like, the first energy is 0.5 eV or less.

During the execution period of the step ST1, the electrons supplied from the electron beam generator 18 are attached to the molecules in the processing gas. Accordingly, negative ions of the molecules in the processing gas are generated. For example, in the case of etching a silicon film of the substrate W in the method MT, negative ions of one or more halogen-containing molecules such as negative ions of $Cl_2$, negative ions of HBr, negative ions of $SF_6$ and the like are generated. In the case of etching a silicon oxide film of the substrate W in the method MT, negative ions of one or more fluorocarbon molecules such as negative ions of $CF_4$, negative ions of $C_4F_8$ and the like are generated. In the case of etching a silicon nitride film of the substrate W in the method MT, negative ions of one or more hydrofluorocarbon molecules such as negative ions of $CH_2F_2$, negative ions of $CHF_3$ and the like are generated. In the step ST1 of one embodiment, electrons are attached to the molecules in the processing gas without dissociating the molecules. In other words, negative ions are generated by non-dissociative electron attachment.

Next, the step ST2 is executed after the execution of the step ST1. In one embodiment, the step ST2 is executed after a predetermined period of time elapses from the completion of the step ST1. In the step ST2, a positive bias voltage is applied to the electrode 26 of the supporting table 14 by the bias power supply 20. In the step ST2, the bias power supply 20 is controlled by performing the second control of the control unit 22.

Specifically, the control unit 22 controls the pulse generator 40 so that the pulse signal PSB having the first level during an execution period of the step ST2 and having the second level during a period before and after the execution period of the step ST2 can be transmitted to the bias power supply 20. Further, the control unit 22 transmits the voltage setting signal for specifying a level of the bias voltage during the execution period of the step ST2 to the bias power supply 20. The bias power supply 20 applies a positive bias voltage having a level specified by the voltage setting signal to the electrode 26 of the supporting table 14 during the execution period of the step ST2 which is specified by the pulse signal PSA.

During the execution period of the step ST2, the positive bias voltage is applied to the electrode 26 of the supporting table 14 and, thus, the negative ions generated in the inner space 12s in the step ST1 are attracted to the substrate W. During the execution period of the step ST2, the substrate W is processed by negative ions.

In one embodiment, then, the step ST3 is executed. In the step ST3, the electrons having the second energy are supplied from the electron beam generator 18 to the inner space 12s. In the step ST3, the control unit 22 performs third control to control the electron beam generator 18.

Specifically, the control unit 22 control the pulse generator 40 to transmit a pulse signal PSA having the first level during the execution period of the step ST3 and having the second level during a period before and after the execution period of the step ST3 to the electron beam generator 18. The first power supply 58 applies a voltage between the electrode 52 and the electrode 54 during the execution period of the step ST3 in response to the pulse signal PSA. Further, in the step ST3, the control unit 22 transmits a voltage setting signal to the electron beam generator 18. The second power supply 60 applies a voltage having a level corresponding to the voltage setting signal between the electrode 54 and the electrode 56 during the execution period of the step ST3 which is specified by the pulse signal PSA. In the step ST3, electrons having the second energy are generated by the electron beam generator 18 and supplied to the inner space 12s. As shown in FIG. 5, the second energy is higher than the first energy of electrons generated in the step ST1. The second energy is used for dissociating molecules contained in the processing gas and is uniquely determined by physical properties of the molecules contained in the processing gas. The second energy is, e.g., higher than 0.5 eV. The second energy may be 10 eV or higher, or may be 50 eV or higher. For example, the second energy of electrons for dissociating $CF_4$ is 4.3 eV or higher; the second energy of electrons for dissociating $SF_6$ is higher than 0.5 eV; and the second energy of electrons for dissociating $c$-$C_4F_8$ is 1.75 eV or higher.

During the execution period of the step ST3, the electrons supplied from the electron beam generator 18 collide with the molecules in the processing gas. Accordingly, the molecules in the processing gas are dissociated, and positive ions are generated. For example, in the case of etching a silicon film of the substrate W in the method MT, positive ions are generated by dissociation of one or more halogen-containing molecules such as $Cl_2$, HBr and the like. In the case of etching a silicon oxide film of the substrate W in the method MT, positive ions are generated by dissociation of one or more fluorocarbon molecules such as $CF_4$, $C_4F_8$ and the like. In the case of etching a silicon nitride film of the substrate W in the method MT, positive ions are generated by dissociation of one or more hydrofluorocarbon molecules such as $CH_2F_2$, $CHF_3$ and the like.

In one embodiment, then, the step ST4 is executed. In the step ST4, a negative bias voltage is applied to the electrode 26 of the supporting table 14 by the bias power supply 20. In the step ST4, the control unit 22 performs fourth control to control the bias power supply 20.

Specifically, the control unit 22 controls the pulse generator 40 to transmit the pulse signal PSB having the first level during an execution period of the step ST4 and having the second level during a period before and after the execution period of the step ST4 to the bias power supply 20. Further, the control unit 22 supplies the voltage setting signal for specifying a level of the bias voltage during the execution period of the step ST4 to the bias power supply 20. The bias power supply 20 applies the negative bias voltage whose level is specified by the voltage setting signal to the electrode 26 of the supporting table 14 during the execution period of the step ST4 which is specified by the pulse signal PSA.

During the execution period of the step ST4, the negative bias voltage is applied to the electrode 26 of the supporting table 14 and, thus, positive ions generated in the inner space 12s in the step ST3 are attracted to the substrate W. During the execution period of the step ST4, the substrate W is processed by the positive ions.

In the case of executing a sequence including the steps ST1 to ST4, i.e., a control sequence including the first control to the fourth control, multiple times, a step ST5 is executed. In the step ST5, it is determined whether or not a stop condition is satisfied. The stop condition is determined to be satisfied when the number of executions of the sequence including the steps ST1 to ST4, i.e., the number of executions of the control sequence including the first control to the fourth control, has reached a predetermined number. When it is determined in the step ST5 that the stop condition is not satisfied, the sequence including the steps ST1 to ST4 is executed again. On the other hand, when it is determined in the step ST5 that the stop condition is satisfied, the execution of the method MT is terminated. The sequence including the steps ST1 to ST4 may be executed once.

In the method MT, negative ions are generated by attaching electrons to molecules in the processing gas. Therefore, heavy negative ions are generated. Since the negative ions are attracted to the substrate W, the straightness of the negative ions is improved and the negative ions can be supplied to a deep portion of an opening. For example, the negative ions can be supplied to a deep portion of an opening having a high aspect ratio.

In one embodiment, the step ST2 is executed after the execution of the step ST1, as described above. In this embodiment, a positive bias voltage is not applied to the electrode 26 of the supporting table 14 during the execution period of the step ST1. Therefore, electrons are prevented from being attracted to the supporting table 14 and the substrate W during the execution period of the step ST1.

Figure 6:
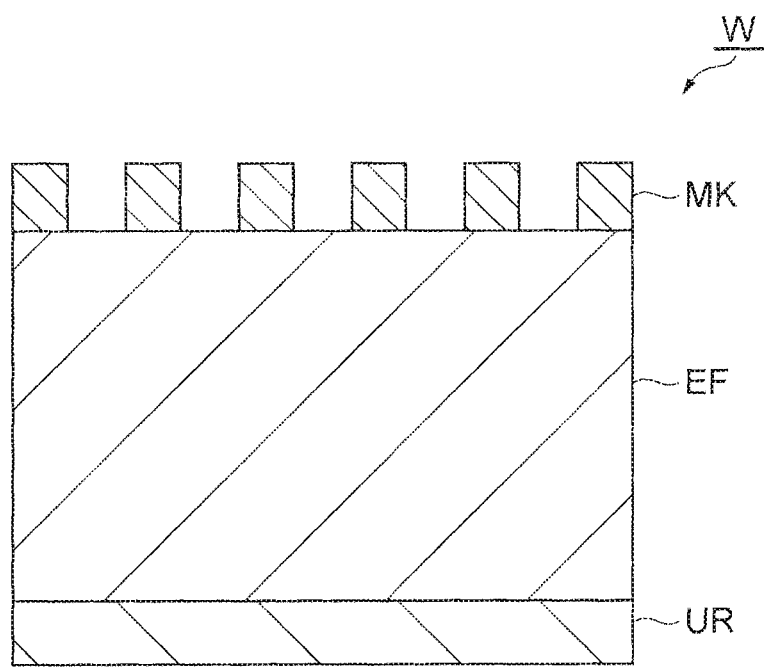
FIG. 6 is a partially enlarged cross sectional view of an example of a substrate to which the substrate processing method shown in FIG. 1 can be applied.
Figure 7A:
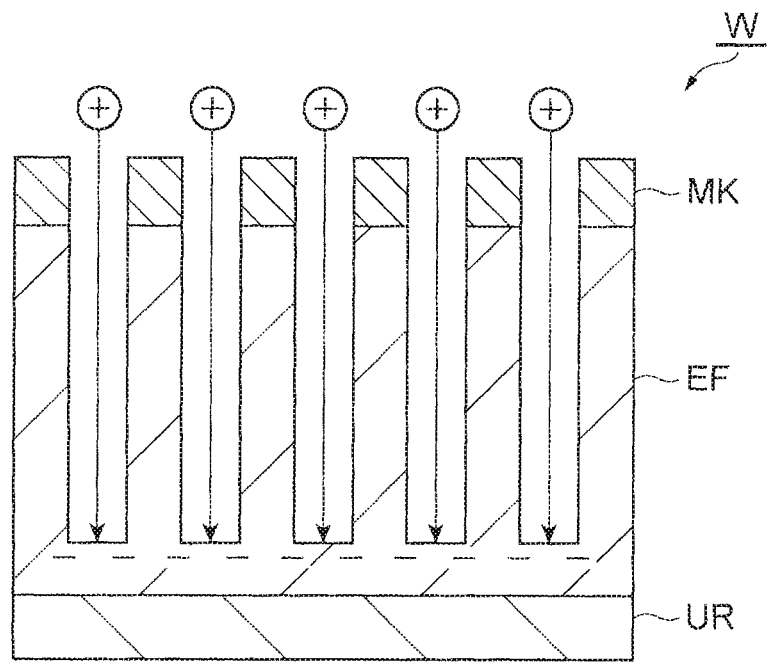
FIG. 7A explains a step ST2 of the substrate processing method shown in FIG. 1.
Figure 7B:
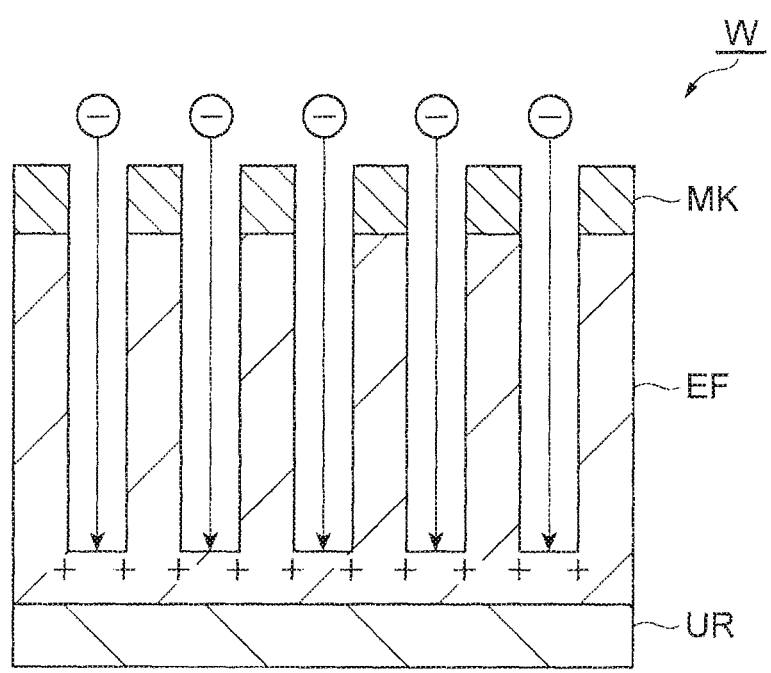
FIG. 7B explains a step ST4 of the substrate processing method shown in FIG. 1.
Figure 8:
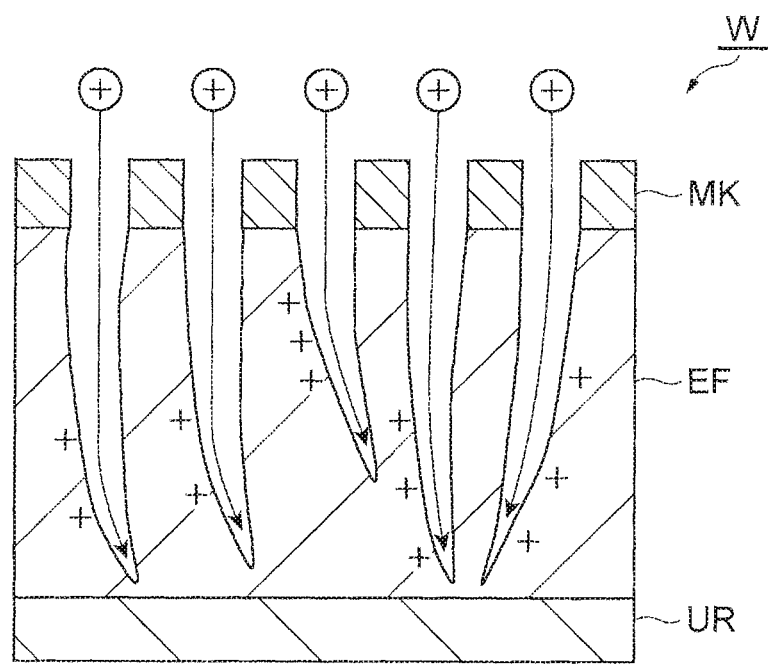
FIG. 8 explains etching using only positive ions.

Hereinafter, FIGS. 6, 7A, 7B, and 8 will be referred to. FIG. 6 is a partially enlarged cross sectional view of an example of a substrate to which the substrate processing method shown in FIG. 1 can be applied. FIG. 7A explains the step ST2 of the substrate processing method shown in FIG. 1. FIG. 7B explains the step ST4 of the substrate processing method shown in FIG. 1. FIG. 8 explains etching using only positive ions.

As shown in FIG. 5, the example of the substrate W to which the method MT can be applied has an underlying region UR, a film EF, and a mask MK. The film EF is provided on the underlying region UR. The film EF is an arbitrary film. The film EF is, e.g., a silicon film, a silicon oxide film, or a silicon nitride film. The mask MK is provided on the film EF and has a pattern partially covering the film EF. In one example of the method MT, the film EF of the substrate W shown in FIG. 6 is etched. In that case, the mask MK is made of a material having an etching rate lower than that of the film EF.

In the step ST1 of the method MT, electrons are attached to the molecules in the processing gas, and negative ions of the molecules are generated without dissociating the molecules. The generated negative ions are heavier than the ions generated by the dissociation of the molecules. In the step ST2, the negative ions are attracted to the substrate W by applying a positive bias voltage to the electrode 26 of the supporting table 14. Therefore, in the step ST2, the negative ions are irradiated with high straightness to the substrate W. Accordingly, the negative ions are supplied to the deep portion of the opening. For example, the negative ions are supplied to the deep portion of the opening having a high aspect ratio. Therefore, in the case of performing the etching of the method MT, the etching can proceed in the deep portion of the opening.

In one embodiment, the positive ions are supplied to the substrate W in the step ST4 after the negative ions are supplied to the substrate W in the step ST2, or the negative ions are supplied to the substrate W in the step ST2 after the positive ions are supplied to the substrate W in the step ST4. In other words, in the method MT, when the substrate W is charged with positive charges, the negative ions are supplied to the substrate W as shown in FIG. 7A. Further, in the method MT, when the substrate W is charged with negative charges, the positive ions are supplied to the substrate W as shown in FIG. 7B.

When the substrate W is etched only by the positive ions, the substrate W is charged with positive charges as shown in FIG. 8. Therefore, the straightness of the positive ions with respect to the substrate W deteriorates. Accordingly, when the substrate W is etched only by the positive ions, the verticality of the opening formed in the substrate W deteriorates. In other words, an opening inclined with respect to a thickness direction of the film EF is formed. On the other hand, in one embodiment of the method MT, as described above, when the substrate W is charged with positive charges, negative ions are supplied to the substrate W. When the substrate W is charged with negative charges, positive ions are supplied to the substrate W. Therefore, the charging of the substrate W is suppressed, and the straightness of ions with respect to the substrate W can be improved. Accordingly, it is possible to supply ions having high straightness to a deep portion of the opening. As a result, when the substrate W is etched, an opening having high verticality can be formed. For example, ions can be supplied to the deep portion of the opening having a high aspect ratio, and an opening having high verticality and a high aspect ratio can be formed.

While various embodiments have been described, various modifications can be made without being limited to the above-described embodiments. For example, in the sequence of the method MT, the steps ST1 and ST2 may be executed after the execution of the steps ST3 and ST4.

Figure 9:
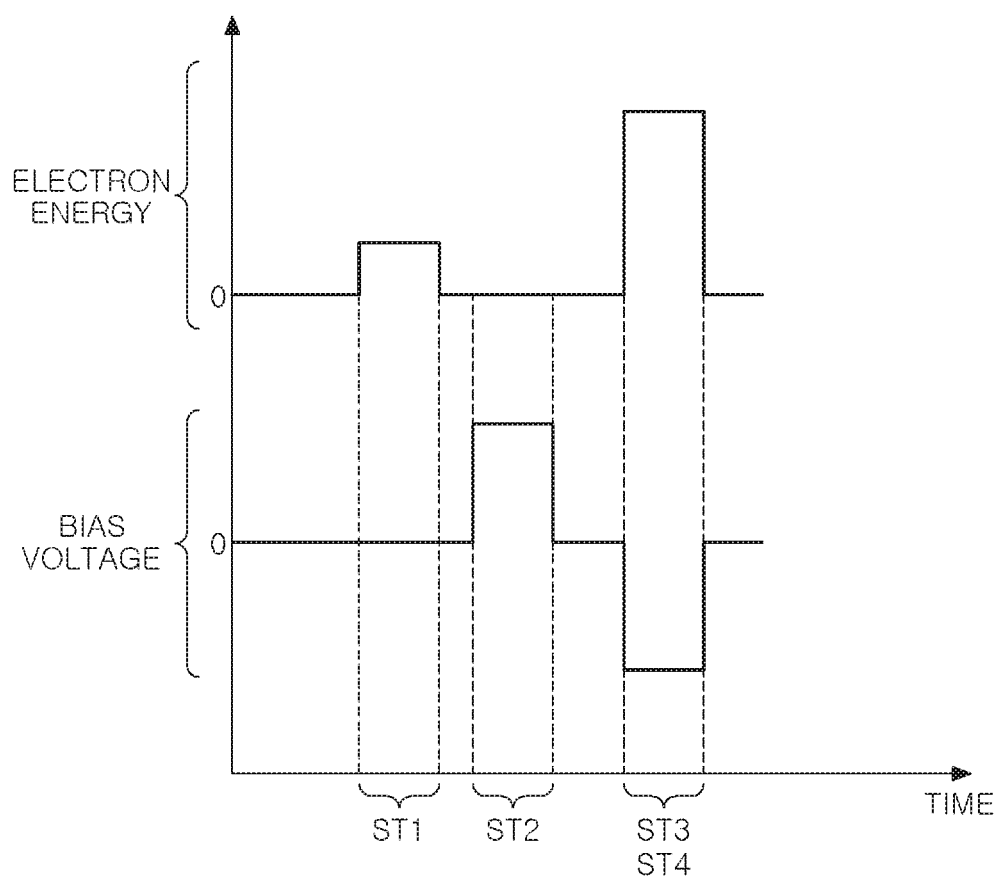
FIG. 9 is a timing chart related to the substrate processing method shown in FIG. 1.

The execution periods of the steps ST3 and ST4 may be different from those in the timing chart of FIG. 5. FIG. 9 is another timing chart related to the substrate processing method shown in FIG. 1. In FIG. 9, the steps ST3 and ST4 are executed during the same period. In the step ST4, a negative bias voltage is applied to the electrode of the support 14. Therefore, even if electrons are supplied to the inner space 12s in the step ST3, the electrons are not attracted to the supporting table 14 and the substrate W. Accordingly, it is possible to execute the steps ST3 and ST4 during the same period.

The bias power supply 20 may be a high frequency power supply for generating a high frequency power. A frequency and a phase of the high frequency power generated by the bias power supply 20 are controlled such that a positive voltage is applied to the electrode 26 of the supporting table 14 during the execution period of the step ST1 and a negative voltage is applied to the electrode 26 of the supporting table 14 during the execution period of the step ST4. When the high frequency power supply is used as the bias power supply 20, a matching unit for impedance matching is provided between the bias power supply 20 and the electrode 26.

The substrate processing apparatus that can be used in the method MT may be any substrate processing apparatus as long as it is possible to control the energy of electrons supplied to the inner space of the chamber body and control a period in which the bias voltage is applied to the electrode of the supporting table, and a polarity and a level of the bias voltage. For example, the electron beam generator of the substrate processing apparatus may include a spindt-type solid state emitter, or may generate electrons by thermo-electron emission from the solid-state emitter, or may generate electrons by the solid state emitter through laser excitation.

Figure 10:
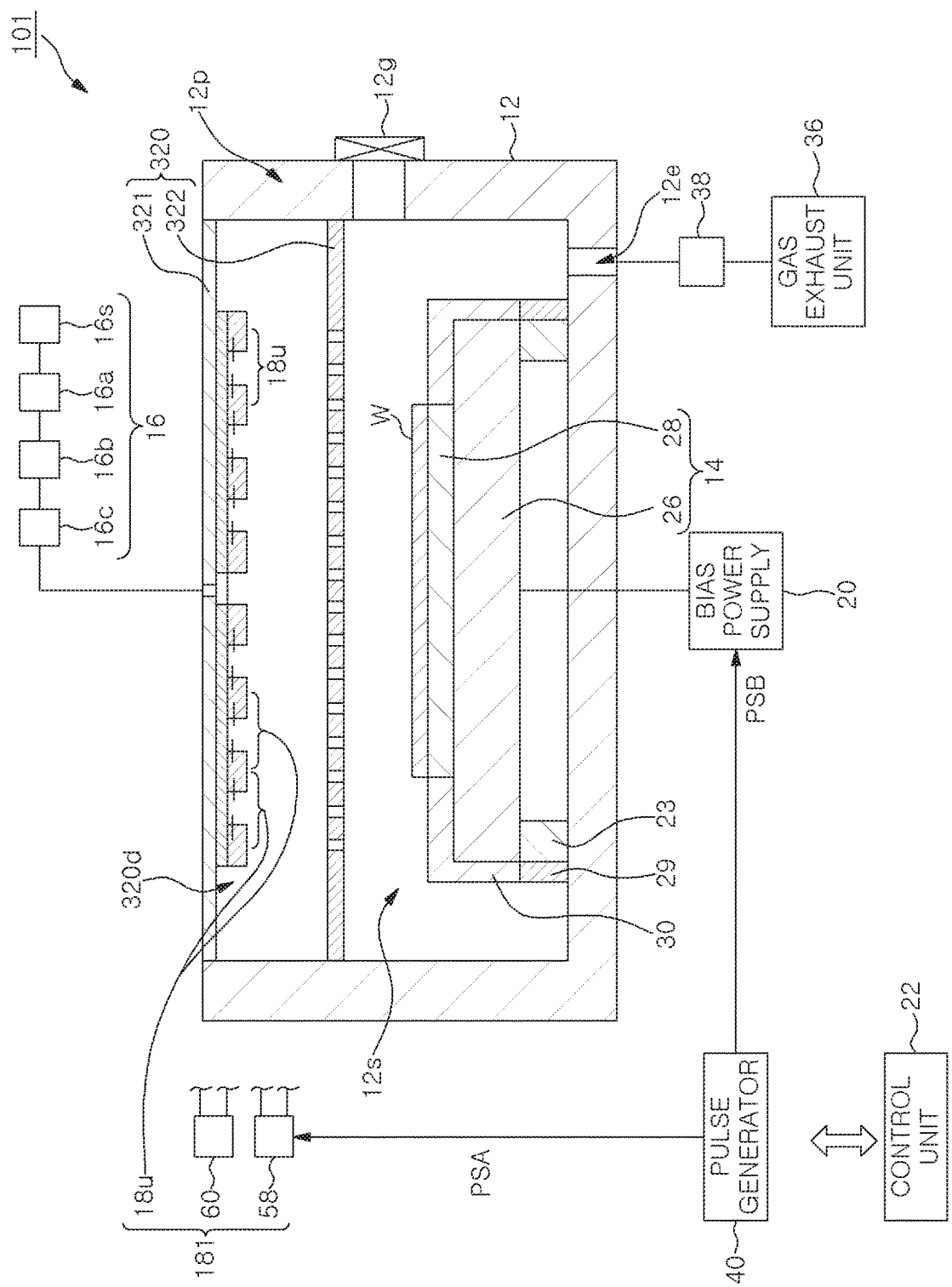
FIG. 10 shows a substrate processing apparatus according to another embodiment.

FIG. 10 shows a substrate processing apparatus according to another embodiment. The substrate processing apparatus 101 shown in FIG. 10 includes an electron beam generator 181 instead of the electron beam generator 18. Further, the substrate processing apparatus 101 has a ceiling portion 320 instead of the ceiling portion 32. The ceiling portion 320 has a lid 321 and an electrode plate 322. The lid 321 closes an opening formed at an upper end of the chamber body 12.

The electrode plate 322 is provided between the lid 321 and the supporting table 14 and extends substantially horizontally. A gas diffusion space 320d is provided between the lid 321 and the electrode plate 322. The gas supply unit 16 is connected to the gas diffusion space 320d. The electrode plate 322 is made of a conductive material such as aluminum or the like. The electrode plate 322 is grounded. A corrosion resistant film is formed on the surface of the electrode plate 322. This film may be, e.g., an alumite film formed by anodic oxidation treatment or a ceramic film made of yttrium oxide. A plurality of through-holes is formed in the electrode plate 322. The gas diffusion space 320d and the inner space 12s communicate with each other through the through-holes of the electrode plate 322.

The electron beam generator 181 includes a plurality of units 18u, a first power supply 58, and a second power supply 60. The units 18u have the same configuration as that of the unit 18u shown in FIG. 3 or 4, and are arranged two-dimensionally directly below the lid 321.

Each of the units 18u of the electron beam generator 181 includes elements for emitting electrons from a single opening of the electrode 56. Specifically, each of the units 18u includes a solid state emitter 50, a part of the electrode 52, a part of the intermediate layer 64, a part of the electrode 54, a part of the intermediate layer 66, and a part of the electrode 56. In each of the units 18u, an opening provided by a part of the electrode 52, a space provided by a part of the intermediate layer 64, an opening provided by a part of the electrode 54, and a space provided by a part of the intermediate layer 66 communicate with a single opening provided by a part of the electrode 56. In each of the units 18u, the solid state emitter 50 protrudes into the opening provided by a part of the electrode 52 or into the space provided by a part of the intermediate layer 64. In the electron beam generator 181, the first power supply 58 is connected between the electrode 52 and the electrode 54, and the second power supply 60 is connected between the electrode 54 and the electrode 56.

In the substrate processing apparatus 101, electrons generated by the electron beam generator 181 are attached to molecules in the gas supplied to the gas diffusion space 320d and, thus, negative ions are generated. Alternatively, the molecules in the gas supplied to the gas diffusion space 320d are dissociated by collision with electrons generated by the electron beam generator 181 and, thus, positive ions are generated. The ions generated in the gas diffusion space 320d are accelerated by the electric field between the electrode plate 322 and the electrode 26 of the supporting table 14 and then supplied to the substrate W.

While the present disclosure has been shown and described with respect to the embodiments, it will be understood by those skilled in the art that various changes and modifications may be made without departing from the scope of the present disclosure as defined in the following claims.

What is claimed is:

1. A substrate processing method comprising:

supplying a processing gas to an inner space of a chamber body of a substrate processing apparatus such that molecules of the processing gas are present in the inner space;

supplying electrons having a first energy from an electron beam generator into the inner space of the chamber body to generate negative ions by attaching the electrons to the molecules in the processing gas supplied to the inner space; and applying a positive bias voltage to an electrode of a supporting table that supports a substrate mounted on thereon in the inner space to attract the negative ions to the substrate, wherein the electron beam generator includes:

a solid state emitter positioned outside of the inner space and within the electron beam generator;

a pair of first electrodes positioned outside of the inner space and within the electron beam generator;

a first power supply configured to apply a voltage between the pair of first electrodes to generate an electric field between the pair of first electrodes and emit electrons from the solid state emitter;

a pair of second electrodes positioned outside of the inner space and within the electron beam generator; and a second power supply configured to apply a voltage between the pair of second electrodes to accelerate electrons emitted from the solid state emitter, wherein the supplying electrons having the first energy includes:

(i) applying, by the first power supply, a voltage between the pair of first electrodes to form the electric field and emit electrons from the solid state emitter within the electron beam generator, and (ii) applying, by the second power supply, a voltage between the pair of second electrodes, to accelerate electrons from the solid state emitter to exit from the electron beam generator and into the inner space, with the electrons exiting the electron beam generator having the first energy controlled by the voltage applied between the pair of second electrodes such that electrons exiting the electron beam generator attach to molecules in the inner space, without dissociating the molecules, to form negative ions of the molecules.

2. The substrate processing method of claim 1, wherein in said applying the positive bias voltage, the substrate is etched by the negative ions of the molecules.

3. The substrate processing method of claim 1, further comprising:

supplying electrons having a second energy higher than the first energy from the electron beam generator to the inner space, with the second energy being sufficient to dissociate the molecules in the processing gas supplied to the inner space and generate positive ions, wherein the supply electrons with the second energy is performed at a time different than the supplying electrons having the first energy; and applying a negative bias voltage to the electrode of the supporting table that supports the substrate mounted thereon in the inner space to attract the positive ions to the substrate.

4. The substrate processing method of claim 3, wherein in said applying the negative bias voltage, the substrate is etched by the positive ions.

5. The substrate processing method of claim 3, wherein a sequence, including said supplying the electrons having the first energy, said applying the positive bias voltage, said supplying the electrons having the second energy and said applying the negative bias voltage, is performed multiple times.

6. The substrate processing method of claim 3, wherein the applying the positive bias voltage is performed after the supplying the electrons having the first energy;

wherein the applying the negative bias voltage is performed at a same time or a different time than the supplying the electrons having the second energy; and wherein, in the attracting the negative ions of the molecules to the substrate, by applying the positive bias voltage, the negative ions of the molecules are heavier than the positive ions attracted to the substrate by applying the negative bias voltage, due to the supplying of the electrons with the first energy attaching to the molecules without dissociating the molecules to form the negative ions of molecules whereas the supplying of the electrons with the second energy dissociates molecules to form the positive ions.

7. The substrate processing method of claim 1, wherein said applying the positive bias voltage is performed after said supplying the electrons having the first energy.

8. A substrate processing apparatus comprising:

a chamber body having an inner space;

a supporting table configured to support a substrate mounted thereon in the inner space, the supporting table including an electrode;

a gas supply unit configured to supply a processing gas to the inner space;

an electron beam generator configured to supply electrons to the inner space;

a bias power supply configured to generate a bias voltage and electrically connected to the electrode of the supporting table; and a control unit configured to control the electron beam generator and the bias power supply, wherein the control unit controls the electron beam generator to supply electrons having a first energy to the inner space in order to generate negative ions of molecules by attaching electrons to molecules in the processing gas supplied to the inner space; and controls the bias power supply to apply a positive bias voltage to the electrode of the supporting table in order to attract the negative ions of molecules to the substrate mounted on the supporting table, wherein the electron beam generator includes:

a solid state emitter positioned outside of the inner space and within the electron beam generator;

a pair of first electrodes positioned outside of the inner space and within the electron beam generator;

a first power supply configured to apply a voltage between the pair of first electrodes to generate an electric field between the pair of first electrodes to emit electrons from the solid state emitter;

a pair of second electrodes positioned outside of the inner space and within the electron beam generator; and a second power supply configured to apply a voltage between the pair of second electrodes in order to accelerate electrons emitted from the solid state emitter, and wherein the control unit is configured to control the first and second power supplies to supply the electrons having the first energy, including:

(i) controlling the first power supply to apply a voltage between the pair of first electrodes to form the electric field to emit electrons from the solid state emitter within the electron beam generator, and (ii) controlling the second power supply to apply a voltage between the pair of second electrodes to accelerate electrons from the solid state emitter to exit from the electron beam generator into the inner space with the first energy, with the control unit controlling the voltage applied between the pair of second electrodes such that electrons exiting the electron beam with the first energy attach to molecules in the inner space without dissociating the molecules to form the negative ions of the molecules.

9. The substrate processing apparatus of claim 8, wherein the control unit is further configured to control the electron beam generator to supply electrons having a second energy higher than the first energy to the inner space in order to generate positive ions by dissociating molecules in the processing gas supplied to the inner space, and controls the bias power supply to apply a negative bias voltage to the electrode of the supporting table in order to attract the positive ions to the substrate supported on the supporting table.

10. The substrate processing apparatus of claim 9, wherein the control unit is configured to perform multiple times a control sequence including the controlling the electron beam generator to supply the electrons having the first energy, the controlling the bias power supply to apply the positive bias voltage, the controlling the electron beam generator to supply the electrons having the second energy, and the controlling the bias power to apply the negative bias voltage.

11. The substrate processing apparatus according to claim 9, wherein the control unit is configured to control the applying of the positive bias power to occur after controlling the electron beam generator to supply electrons having the first energy to form the negative ions of molecules;

wherein the control unit is configured to control the applying of the negative bias power to occur at a same time or a different time than controlling the electron beam generator to supply electrons of the second energy into the inner space to form the positive ions, and wherein by the control unit controlling the electron beam generator to supply electrons with the first energy which does not dissociate molecules to form the negative ions of molecules and to supply electrons with the second energy which dissociates molecules to form positive ions, negative ions of the molecules attracted to the substrate with the positive bias voltage are heavier than positive ions attracted to the substrate with the negative bias voltage.

12. The substrate processing apparatus of claim 8, wherein the control unit controls the electron beam generator to supply the electrons having the first energy and thereafter controls the bias power supply to apply the positive bias voltage.

* * * * *